US008580343B2

(12) United States Patent
Jiang et al.

(10) Patent No.: US 8,580,343 B2
(45) Date of Patent: Nov. 12, 2013

(54) METHOD FOR FABRICATING COMPOSITE CARBON NANOTUBE STRUCTURE

(75) Inventors: Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/113,206

(22) Filed: May 23, 2011

(65) Prior Publication Data

US 2012/0164375 A1 Jun. 28, 2012

(30) Foreign Application Priority Data

Dec. 27, 2010 (CN) .......................... 2010 1 0607353

(51) Int. Cl.
*C23C 16/26* (2006.01)

(52) U.S. Cl.
USPC .................. 427/249.1; 427/249.3; 427/249.4; 427/301

(58) Field of Classification Search
USPC ......................... 427/249.1, 249.3, 249.4, 301
See application file for complete search history.

(56) References Cited

U.S. PATENT DOCUMENTS 7,992,616 B2 8/2011 Liu et al.
8,076,836 B2 * 12/2011 Liu et al. ....................... 313/503
8,389,058 B2 * 3/2013 Liu et al. ....................... 427/355
2003/0004058 A1 * 1/2003 Li et al. ........................ 502/258
2004/0095050 A1 5/2004 Liu et al.
2005/0215049 A1 * 9/2005 Horibe et al. ................. 438/622
2006/0192475 A1 8/2006 Lee et al.
2009/0155467 A1 * 6/2009 Wang et al. .................. 427/294
2009/0181239 A1 * 7/2009 Fan et al. ...................... 428/327
2010/0282403 A1 11/2010 Liu et al.

FOREIGN PATENT DOCUMENTS

| | | |
|---|---|---|
| CN | 1501422 A | 6/2004 |
| CN | 1767122 | 5/2006 |
| CN | 101407312 | 4/2009 |
| JP | 2004-165144 | 6/2004 |
| JP | 2006-114494 | 4/2006 |
| TW | 201040015 | 11/2010 |
| TW | 201040105 | 11/2010 |

OTHER PUBLICATIONS

Jiang, Kaili, et al., "Spinning continuous carbon nanotube yarns". Nature, vol. 419, Oct. 24, 2002, p. 801.*
Zhang, Shuang, et al., "Draw out Carbon Nanotube from Liquid Carbon". pp. 1-14. Citation and date unavailable.*

* cited by examiner

*Primary Examiner* — Bret Chen
(74) *Attorney, Agent, or Firm* — Altis & Wispro Law Group, Inc.

(57) ABSTRACT

A method for fabricating composite carbon nanotube structure is presented. A carbon nanotube array is provided. A first carbon nanotube structure is drawn from the carbon nanotube array. The first carbon nanotube structure is located on the substrate. A second carbon nanotube structure is grown on a surface of the first carbon nanotube structure to form a composite carbon nanotube structure. A composite carbon nanotube structure is also presented.

19 Claims, 6 Drawing Sheets

METHOD FOR FABRICATING COMPOSITE CARBON NANOTUBE STRUCTURE

RELATED APPLICATIONS

This application claims all benefits accruing under 35 U.S.C. §119 from China Patent Application 201010607353.X, filed on Dec. 27, 2010 in the China Intellectual Property Office, the disclosure of which is incorporated herein by reference. This application is related to applications entitled, "FIELD EMISSION CATHODE STRUCTURE AND METHOD FOR FABRICATING THE SAME", filed May 23, 2011 Ser. No. 13/113,202.

BACKGROUND

1. Technical Field

The present disclosure relates to a composite carbon nanotube structure and a method for fabricating the same.

2. Discussion of Related Art

Carbon nanotubes (CNTs) are electrically conductive along their length, chemically stable, and have a very small diameter (much less than 100 nanometers) and large aspect ratios (length/diameter). Due to these and other properties, it has been suggested that CNTs can play an important role in many fields, such as field emission device.

At present, different methods are widely used for fabricating composite carbon nanotube structure. CNTs can be produced by means of arc discharge between graphite rods. Another method for fabricating composite carbon nanotube structure has been disclosed in U.S. Patent Application No. 20060192475. However, this method is complex because the first carbon nanotubes should be separated from the first substrate by ultrasonic method, immersed into a solution, and then coated on the second substrate. Furthermore, while immersing the first carbon nanotubes into the solution, some catalysts on the surface of the first carbon nanotubes will drop off, such that only a few second carbon nanotubes can be obtained on the surface of the first carbon nanotubes.

What is needed, therefore, is to provide a simple and effective method to fabricate composite carbon nanotube structure.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
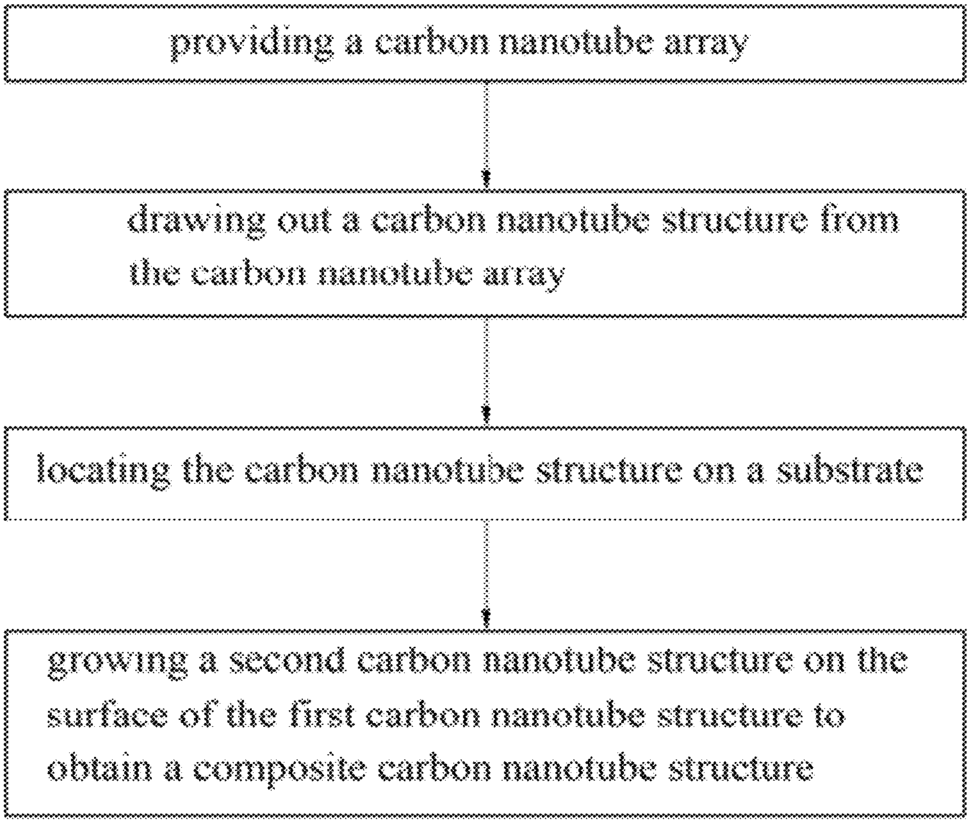
FIG. 1 is a flow chart of one embodiment of a method for fabricating a composite carbon nanotube structure.

Referring to FIG. 1, a method of one embodiment for fabricating a composite carbon nanotube structure 200 includes:

(S11) providing a carbon nanotube array;

(S12) drawing out a first carbon nanotube structure 212 from the carbon nanotube array;

(S13) laying the first carbon nanotube structure 212 on a substrate 220;

(S14) growing a second carbon nanotube structure 214 on a surface of the first carbon nanotube structure 212.

In step (S11), the carbon nanotube array can be a super-aligned carbon nanotube array. In one embodiment, a method of growing the super-aligned carbon nanotube array on the substrate includes:

(S111) providing a substantially flat and smooth substrate;

(S112) forming a catalyst layer on the substrate and annealing the substrate with the catalyst; and (S113) putting the substrate into a furnace and growing a super-aligned array of the carbon nanotubes from the substrate by a chemical vapor deposition (CVD) method.

In step (S111), the substrate can be a silicon wafer or a silicon wafer with a film of silicon dioxide thereon. In one embodiment, a 4-inch silicon wafer is used as the substrate. The surface of the substrate can be treated with a mechanical polishing method or electrochemical polishing method.

In step (S112), the method of forming the catalyst layer on the substrate and annealing the substrate includes:

(a) forming a catalyst layer on the substrate, wherein the thickness of the catalyst layer can be about 4 nm to about 10 nm, and the catalyst can be made of iron (Fe), cobalt (Co), nickel (Ni), or any alloy thereof;

(b) annealing the substrate with the catalyst at a temperature in the range from about 700° C. to about 900° C. in air for about 30 minutes to about 90 minutes, thereby the catalyst layer will be dispersed into nano-scale catalyst particles 213 dispersing on the surface of the substrate.

In step (S113), the substrate with the catalyst is heated at a temperature in the range from about 500° C. to about 740° C. in a furnace with a protective gas therein, and supplying a carbon source gas into the furnace for about 5 minutes to about 30 minutes. The protective gas can be made up of at least one of nitrogen ($N_2$), ammonia ($NH_3$), and a noble gas. The carbon source gas can be a hydrocarbon gas, such as ethylene ($C_2H_4$), methane ($CH_4$), acetylene ($C_2H_2$), ethane ($C_2H_6$), or any combination thereof. The super-aligned carbon nanotube array can, opportunely, have a height of about 200 microns to about 400 microns and include a plurality of carbon nanotubes substantially parallel to each other and substantially perpendicular to the substrate. The carbon nanotubes can be single-walled carbon nanotubes, double-walled carbon nanotubes, multi-walled carbon nanotubes, or any combination thereof.

During the process of growing the carbon nanotubes, the catalyst particles 213 can be located at the top of the carbon nanotubes or the bottom of the carbon nanotubes depending on the different growth mechanism being tip-growth or base-growth.

In step (S12), the first carbon nanotube structure 212 can be a carbon nanotube film. In one embodiment, the carbon nanotube film can be drawn out from the super-aligned carbon nanotube array by the substeps of:

(b1) selecting a plurality of carbon nanotube segments having a predetermined width; and (b2) drawing the carbon nanotube segments at a substantially even/uniform speed to form the carbon nanotube film.

The carbon nanotube segments can be drawn using a tool (e.g., adhesive tape) allowing multiple carbon nanotubes to be gripped and pulled simultaneously. During the drawing process, as the initial carbon nanotube segments are drawn out, other carbon nanotube segments are also drawn out end to end, due to the van der Waals attractive force between ends of the adjacent segments. This process of drawing ensures a successive carbon nanotube film can be formed. The carbon nanotubes of the carbon nanotube film are all substantially parallel to the drawing direction, and the carbon nanotube film produced in such manner is able to be formed to have a selectable, predetermined width. The drawn carbon nanotube film can include a plurality of successively oriented carbon nanotube segments joined end-to-end by van der Waals attractive force therebetween. Each carbon nanotube segment includes a plurality of carbon nanotubes substantially parallel to each other, and joined end to end by van der Waals attractive force therebetween. Most of the carbon nanotubes in the carbon nanotube film extending substantially along the drawn direction. The carbon nanotube segments can vary in width, thickness, uniformity, and shape. The carbon nanotubes in the drawn carbon nanotube film are also substantially oriented along a preferred orientation.

The width of the carbon nanotube film depends on the size of the carbon nanotube array. The length of the carbon nanotube film is arbitrary. In one embodiment, when the size of the substrate is 4 inches, the width of the carbon nanotube film is in the range from about 1 centimeter to about 10 centimeters, and the thickness of the carbon nanotube film is in the range from about 0.01 microns to about 100 microns.

Figure 2:
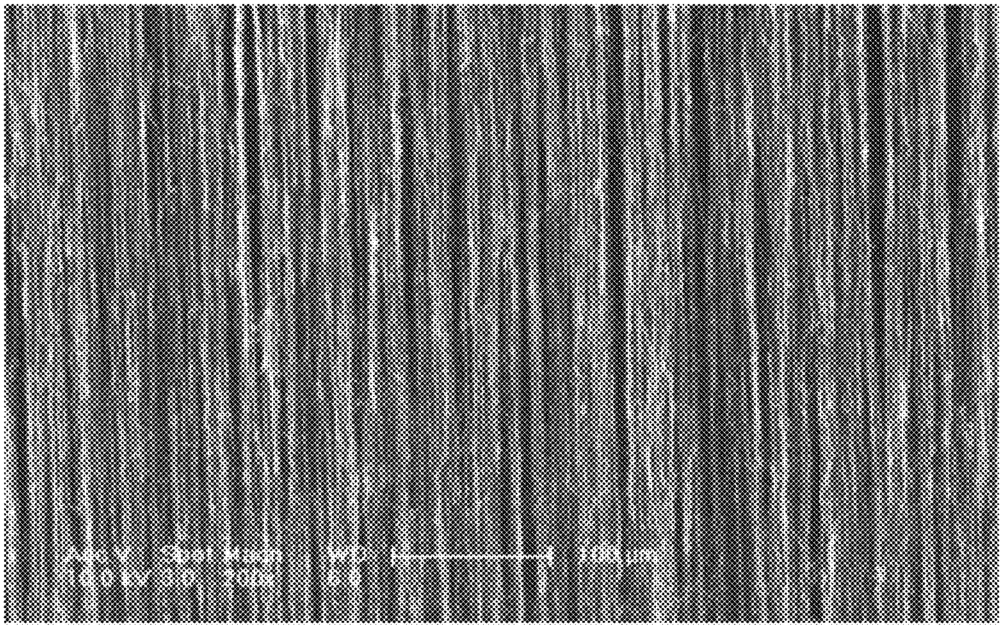
FIG. 2 shows a Scanning Electron Microscope (SEM) image of one embodiment of a carbon nanotube film.

Referring to FIG. 2, the carbon nanotube film can be a free-standing structure. The term "free-standing structure" means that the carbon nanotube film can sustain the weight of itself when it is hoisted by a portion thereof without any significant damage to its structural integrity. So, if the carbon nanotube film is placed between two separate supports, a portion of the carbon nanotube film not in contact with the two supports would be suspended between the two supports and maintain film structural integrity. The carbon nanotube film includes a plurality of carbon nanotubes distributed uniformly and attracted by van der Waals attractive force therebetween. The carbon nanotubes in the carbon nanotube film can be orderly aligned. The orderly aligned carbon nanotubes are arranged in a consistently systematic manner, e.g., most of the carbon nanotubes are arranged approximately along a same direction.

Figure 3:
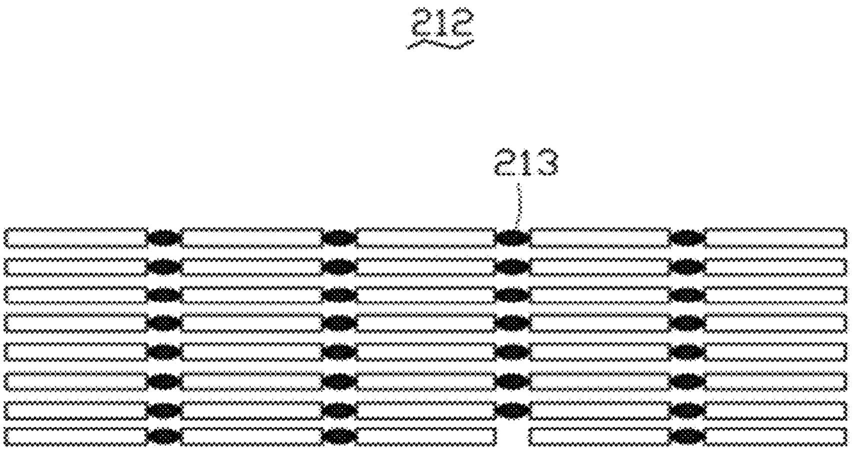
FIG. 3 shows a schematic view of one embodiment of a first carbon nanotube structure.

Referring to FIG. 3, during the process of drawing the carbon nanotube film from the carbon nanotube array, some of the catalyst particles 213 will be separated from the substrate and attached to one end of each carbon nanotube. Therefore, the catalyst particles 213 will be dispersed in the carbon nanotube film. The catalyst particles 213 are located on the junction between two ends of adjacent carbon nanotubes which are joined by van der Waals force. Because the carbon nanotubes have substantially the same length, the carbon nanotube segment also has substantially the same length, and the catalyst particles 213 are uniformly dispersed in the carbon nanotube film. The term "uniformly" means that the catalyst particles 213 are dispersed in the carbon nanotube film at substantially the same interval along the drawing direction.

Figure 4:
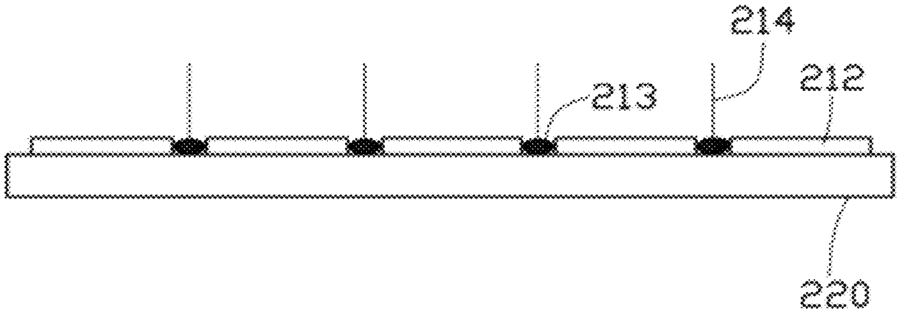
FIG. 4 shows a schematic view of one embodiment of a composite carbon nanotube structure attached on a substrate.
Figure 5:
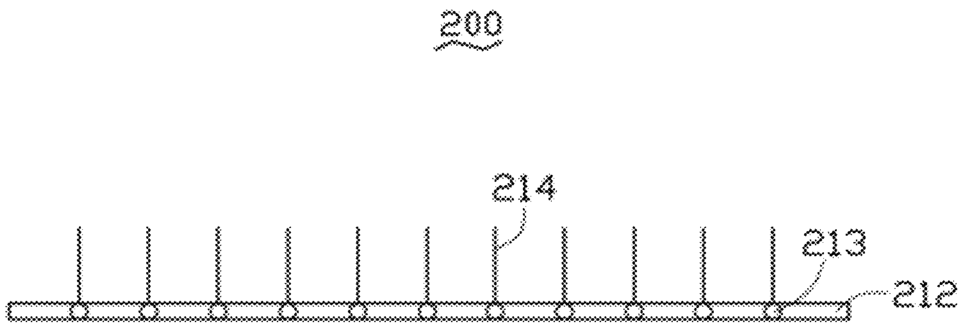
FIG. 5 shows a schematic view of one embodiment of a composite carbon nanotube structure.

In step (S13), the material of the substrate 220 can be the same as the substrate for growing the carbon nanotube array used in step (S11). Referring to FIG. 4 and FIG. 5, the first carbon nanotube structure 212 can be attached to one surface of the substrate 220 by itself or fixed on the surface of the substrate 220 with a fixing device (not shown). In one embodiment, the first carbon nanotube structure 212 is suspended between two supports, and the opposite ends of the first carbon nanotube structure 212 are fixed on the two supports. The shape of the support is arbitrary, so long as the support has a surface attached with one end of the carbon nanotube film.

In one embodiment, more than one first carbon nanotube structure 212 can be stacked on the substrate 220. The two adjacent first carbon nanotube structures 212 are joined by van der Waals force. An angle between the aligned directions of the carbon nanotubes in the two adjacent first carbon nanotube structures 212 can range from about 0 degrees to about 90 degrees ($0°\leq\alpha\leq90°$). The stacked carbon nanotube structures 212 have the advantages of improving the strength and maintaining the shape and structure of the composite carbon nanotube structure 200.

In step (S14), the second carbon nanotube structure 214 can be fabricated by a chemical vapor deposition (CVD) method. In one embodiment, the method of growing the second carbon nanotube structure 214 includes:

(S141) putting the substrate 220 into a furnace with a protective gas therein;

(S142) heating the substrate 220; and (S143) introducing a carbon source gas to grow new carbon nanotubes on the surface of the first carbon nanotube structure 212.

In one embodiment, the second carbon nanotube structure 214 is grown on the catalyst particles 213 dispersed in the first carbon nanotube structure 212. The second carbon nanotube structure 214 includes a number of carbon nanotubes. Each of the carbon nanotubes of the second carbon nanotube structure 214 includes two opposite ends. One end is joined to the first carbon nanotube structure 212, and the other end extends far away from the first carbon nanotube structure 212.

Furthermore, if the catalyst particles 213 remaining in the first carbon nanotube structure 212 are too few, a step of depositing catalyst particles on the surface of first carbon nanotube structure 212 can be performed after step (S13) to increase the catalyst particles content of the first carbon nanotube structure 212. Thus, the first carbon nanotube structure 212 can have catalyst particles not only at the junction between two ends of adjacent carbon nanotubes but also at the surface of each carbon nanotube. The catalyst particles can be uniformly deposited by a method of electron beam evaporation, sputtering, plasma beam deposition, electro-deposition, or coating.

Furthermore, an optional step (S15) of removing the substrate 220 can be performed after step (S14).

The method of fabricating the composite carbon nanotube structure has the following advantages. First, the second carbon nanotube structure is grown on the first carbon nanotube structure directly drawn out from the carbon nanotube array, so the process is simple and suitable for industrial production. Second, the first carbon nanotube structure is directly drawn out from the carbon nanotube array, and does not need to be immersed into solution, so there are more catalyst particles dispersing on the surface of the first carbon nanotube structure. Third, the catalyst particles are located at the junction of adjacent carbon nanotubes of the first carbon nanotube structure, so the catalyst particles can be uniformly dispersed on the surface. Thus, it is convenient to grow carbon nanotube array on the surface of first carbon nanotube structure.

Figure 6:
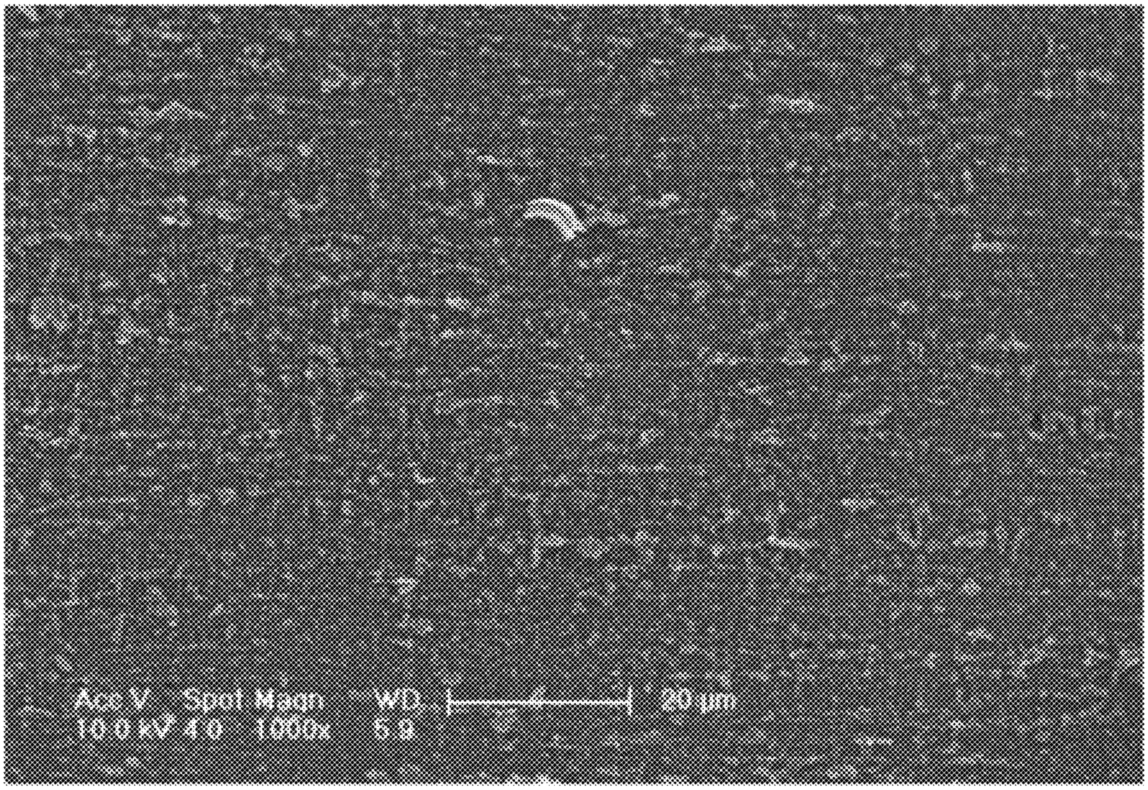
FIG. 6 shows an SEM image of one embodiment of a composite carbon nanotube structure.

Referring to FIG. 5 and FIG. 6, the fabricated composite carbon nanotube structure 200 includes a first carbon nanotube structure 212 and a second carbon nanotube structure 214 located thereon. The first carbon nanotube structure 212 is a freestanding structure. The first carbon nanotube structure 212 includes a plurality of successive and oriented carbon nanotubes joined end to end by van der Waals force. Most of the carbon nanotubes in the first carbon nanotube structure 212 extend substantially along the same direction. The carbon nanotubes of the first carbon nanotube structure 212 are all substantially parallel to the surface of first carbon nanotube structure 212 and oriented along a preferred orientation. The second carbon nanotube structure 214 includes a plurality of carbon nanotubes extending from the first carbon nanotube structure 212.

In one embodiment, each first carbon nanotube structure 212 includes a plurality of successively oriented carbon nanotube segments joined end-to-end by van der Waals force therebetween. Each carbon nanotube segment includes a plurality of carbon nanotubes substantially parallel to each other, and combined by van der Waals force therebetween. The carbon nanotube segments can vary in width, thickness, uniformity, and shape.

In one embodiment, the composite carbon nanotube structure 200 can include more than one first carbon nanotube structure 212. The first carbon nanotube structures 212 are stacked together to form an integrated structure. The two adjacent first carbon nanotube structures 212 are joined by van der Waals force. An angle between the aligned directions of the carbon nanotube in the two adjacent first carbon nanotube structures 212 can range from about 0 degrees to about 90 degrees ($0° \leq \alpha \leq 90°$). The stacked first carbon nanotube structures 212 have the advantages of improving the strength of the composite carbon nanotube structure 200 and maintaining its shape and structure.

The first carbon nanotube structure 212 further includes a plurality of catalyst particles 213. The catalyst particles 213 are located at one end of the carbon nanotubes of the first carbon nanotube structure 212. In one embodiment, the catalyst particles 213 are located at the junction between two ends of adjacent carbon nanotubes joined by van der Waals force. Because the carbon nanotubes have approximately the same length, the catalyst particles 213 can uniformly disperse with the same interval.

The second carbon nanotube structure 214 includes a plurality of carbon nanotubes. The carbon nanotubes are substantially parallel to each other and substantially perpendicular to the surface of first carbon nanotube structure 212. Each carbon nanotube includes a first end connected to the surface of first carbon nanotube structure 212 and a second end extending away from the first carbon nanotube structure 212. The carbon nanotubes of the second carbon nanotube structure 214 have substantially the same length and substantially the same interval along the aligned direction of the carbon nanotubes in the first carbon nanotube structure 212. In one embodiment, the carbon nanotubes of the second carbon nanotube structure 214 are located on the catalyst particles 213 dispersed in the first carbon nanotube structure 212.

The composite carbon nanotube structure can be used in a field emission device. In one embodiment, it can be used in a thermal field emission device. If the composite carbon nanotube is used in the thermal field emission device, a current can be introduced in the first carbon nanotube structure, causing the first carbon nanotube structure to emit Joule-heating, thereby heating the second carbon nanotube structure. The first carbon nanotube structure has a small heating consumption and fast response due to the small heat capacity of the first carbon nanotube structure, so the adsorption effect of the second carbon nanotube structure can be effectively reduced in a very short time period (at the millisecond magnitude) and the thermal filed emission can be used in the fast response applications such as field emission display and etc.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

The invention claimed is:

1. A method for fabricating composite carbon nanotube structure, the method comprising:

providing an array of first carbon nanotubes;

making a first carbon nanotube structure by drawing a structure from the array of first carbon nanotubes so that the first carbon nanotubes are joined end to end, and a plurality of first catalyst particles is dispersed in the first carbon nanotube structure; and growing a second carbon nanotube structure on a surface of the first carbon nanotube structure through the plurality of first catalyst particles.

2. The method of claim 1, wherein the first carbon nanotube structure is a drawn carbon nanotube film, and the second carbon nanotube structure is grown using a chemical vapor deposition method.

3. The method of claim 2, wherein the plurality of first carbon nanotubes are joined end-to-end by van der Waals attractive force therebetween.

4. The method of claim 3, wherein most of the plurality of first carbon nanotubes in the first carbon nanotube structure extend substantially along an alignment direction.

5. The method of claim 4, wherein the first catalyst particles are dispersed in the first carbon nanotube structure at approximately a same interval along the alignment direction of the plurality of first carbon nanotubes.

6. The method of claim 1, wherein the first catalyst particles are dispersed at junctions where the first carbon nanotubes are joined end to end.

7. The method of claim 1, further comprising depositing a plurality of second catalyst particles on a surface of the first carbon nanotube structure before growing the second carbon nanotube structure.

8. The method of claim 7, wherein the second catalyst particles are deposited by a method of electron beam evaporation, sputtering, plasma beam deposition, or electro-deposition.

9. The method of claim 1, wherein the first carbon nanotube structure is drawn to be a carbon nanotube film, and the carbon nanotube film is free-standing.

10. The method of claim 1, further comprising a step of providing a substrate, and laying the first carbon nanotube structure on the substrate.

11. The method of claim 10, further comprising making a plurality of first carbon nanotube structures and stacking the plurality of first carbon nanotube structures on the substrate to form a multi-layer structure.

12. The method of claim 10, wherein the substrate is heated to a temperature in a range from about 500° C. to about 740° C.

13. The method of claim 10, wherein the step of growing the second carbon nanotube structure comprises:

putting the substrate into a protective gas environment;

heating the substrate; and introducing a carbon source gas into the protective gas environment to grow the second carbon nanotube structure on the surface of the first carbon nanotube structure.

14. The method of claim 10, further comprising a step of removing the substrate after growing the second carbon nanotube structure.

15. The method of claim 10, wherein the first carbon nanotube structure is a free-standing structure, and the first carbon nanotube structure is directly attached on a surface of the substrate.

16. The method of claim 1, wherein the second carbon nanotube structure is grown by growing a plurality of second carbon nanotubes substantially perpendicular to the first carbon nanotube structure.

17. The method of claim 16, wherein the plurality of second carbon nanotubes is grown on the first carbon nanotube structure at a certain interval.

18. A method for fabricating composite carbon nanotube structure, the method comprising:

drawing out a carbon nanotube film from a carbon nanotube array; and growing a plurality of carbon nanotubes on a surface of the carbon nanotube film, wherein each of the plurality of carbon nanotubes comprises a first end and a second end opposite to the first end, the first end is connected to the surface of the carbon nanotube film, and a second end extends away from the carbon nanotube film.

19. A method for fabricating composite carbon nanotube structure, the method comprising:

drawing out a first carbon nanotube structure from a carbon nanotube array, wherein the first carbon nanotube structure comprises a plurality of successively oriented first carbon nanotubes joined end to end; and growing a plurality of second carbon nanotubes on the first carbon nanotube structure.

* * * * *